(12) United States Patent
Horino et al.

(10) Patent No.: US 9,316,686 B2
(45) Date of Patent: Apr. 19, 2016

(54) HANDLER AND TEST APPARATUS

(71) Applicant: ADVANTEST CORPORATION, Tokyo (JP)

(72) Inventors: Hiromitsu Horino, Saitama (JP); Masataka Onozawa, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 680 days.

(21) Appl. No.: 13/671,568

(22) Filed: Nov. 8, 2012

(65) Prior Publication Data
US 2013/0181734 A1   Jul. 18, 2013

(30) Foreign Application Priority Data

Jan. 13, 2012 (JP) ................................. 2012-004996

(51) Int. Cl.
*G01R 1/04* (2006.01)
*G01R 31/28* (2006.01)

(52) U.S. Cl.
CPC ........ G01R 31/2891 (2013.01); G01R 31/2893 (2013.01); *G01R 31/2867* (2013.01); *G01R 31/2874* (2013.01)

(58) Field of Classification Search
CPC ........... G01R 31/2893; G01R 31/2891; G01R 31/2886; G01R 31/2887
USPC ................................................... 324/750.23
See application file for complete search history.

(56) References Cited

U.S. PATENT DOCUMENTS

| 6,313,654 | B1* | 11/2001 | Nansai ................... G01R 31/01 219/412 |
| 6,445,201 | B1* | 9/2002 | Simizu ................. G01R 1/0483 324/750.02 |
| 2004/0077200 | A1* | 4/2004 | Ishikawa .............. G01R 1/0458 439/190 |
| 2008/0238460 | A1* | 10/2008 | Kress ................. G01R 31/2891 324/756.02 |

(Continued)

FOREIGN PATENT DOCUMENTS

JP        2007-333697 A    12/2007
KR   10-2011-0126060 A    11/2011

(Continued)

OTHER PUBLICATIONS

Notice of Office Action for Korean Patent Appl. No. 10-2012-0125471, issued by the Korean Intellectual Property Office on Nov. 12, 2013.

(Continued)

*Primary Examiner* — Jermele M Hollington
*Assistant Examiner* — Dustin Dickinson

(57) ABSTRACT

A handler for conveying a plurality of devices under test to a socket for a test that can reduce a test time includes: a test section provided with the socket; a heat applying section into which a tray having a plurality of devices under test placed on its surface is conveyed and that controls the temperature of the devices under test to a predetermined test temperature and conveys the tray into the test section; a device image capturing section that in the heat applying section, captures images of the respective devices under test by moving with respect to the surface of the tray in two non-parallel directions of a first direction and a second direction; and a position adjusting section that adjusts the positions of the devices under test with respect to the socket based on the images of the devices under test captured by the device image capturing section.

15 Claims, 16 Drawing Sheets

(56) References Cited

U.S. PATENT DOCUMENTS

| | | | | |
|---|---|---|---|---|
| 2009/0136118 | A1* | 5/2009 | Ichikawa | 382/145 |
| 2009/0261817 | A1* | 10/2009 | Beom | G01R 31/2893 324/757.01 |
| 2011/0156734 | A1* | 6/2011 | Berry | G01R 31/2891 324/750.19 |
| 2011/0279136 | A1* | 11/2011 | Shiozawa | 324/750.23 |

FOREIGN PATENT DOCUMENTS

| | | | |
|---|---|---|---|
| TW | 561070 | B | 11/2003 |
| TW | I228599 | B | 3/2005 |
| TW | I283649 | B | 7/2007 |

OTHER PUBLICATIONS

Preliminary Notice of First Office Action for Patent Application No. 101139302, issued by the Taiwanese Intellectual Property Office on Apr. 22, 2014.

* cited by examiner

— HANDLER AND TEST APPARATUS

The contents of the following Japanese Patent Application is incorporated herein by reference:
No. 2012-004996 filed on Jan. 13, 2012.

BACKGROUND

1. Technical Field

The present invention relates to a hander and a test apparatus.

2. Related Art

Conventionally, a technique has been known which, inside a test section of a hander, captures images of sockets and devices under test and aligns the positions of the devices under test with the positions of the sockets (see, e.g., Patent Document 1).

Patent Document 1: Japanese Patent Application Publication No. 2007-333697

However, devices under test must stay in the test section for a long time if image capture and position alignment of the sockets and the devices under test are performed after the devices under test are conveyed into the test section. Since the tray on which devices under test to be tested next are placed is conveyed into the test section in exchange for the previous tray, the total test time will be long if devices under test stay in the test section for a long time.

Further, because image capture and position alignment are performed on devices under test that are attractively supported on a contact arm in the test section, the number of devices under test that can be subjected to image capture and position alignment at a time is limited. Therefore, the larger the number of devices under test, the longer the test time will be.

SUMMARY

To solve the problem described above, provided according to a first aspect of the innovations herein is a handler for conveying a plurality of devices under test to a socket for a test, including: a test section in which the socket is provided; a heat applying section into which a tray on a surface of which the plurality of devices under test are placed is conveyed and that controls the temperature of the plurality of devices under test to a predetermined test temperature and conveys the tray into the test section; a device image capturing section that in the heat applying section, captures images of the respective devices under test by moving with respect to the surface of the tray in two non-parallel directions of a first direction and a second direction; and a position adjusting section that adjusts the positions of the plurality of devices under test with respect to the socket based on the images of the plurality of devices under test captured by the device image capturing section.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
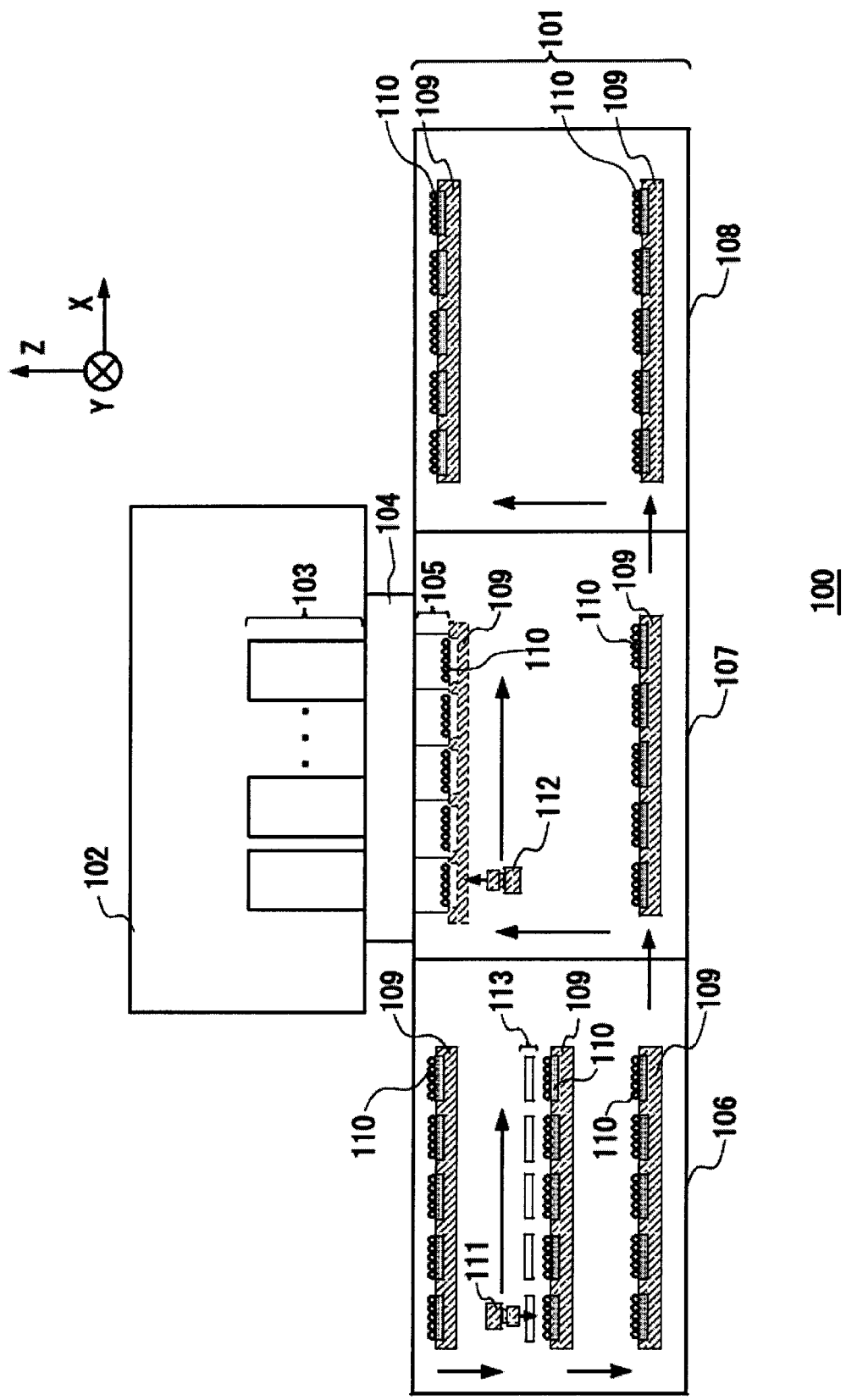
FIG. 1 shows a cross sectional view of a handler according to a first embodiment of the present invention.

FIG. 1 shows an overview of a test apparatus 100. The test apparatus 100 includes a hander 101, a test head 102, and a connection switching section 104. The test apparatus 100 may further include a main frame that controls the test head 102, etc. The test apparatus 100 tests a plurality of devices under test 110 such as an analog circuit, a digital circuit, an analog/digital consolidated circuit, a memory, a system-on-chip (SOC), etc.

The test head 102 houses a plurality of test modules 103. The test modules 103 test the devices under test 110 while being connected to the devices under test 110 via the test head 102 and the connection switching section 104. For example, the test modules 103 input a test signal corresponding to a test pattern supplied by a user to the devices under test 110, and based on response signals output by the devices under test 110, judge whether the respective devices under test 110 are pass or fail.

The connection switching section 104 switches connections between a plurality of sockets 105 in a test section 107 and the respective test modules 103. The devices under test 110 are set on the sockets 105 respectively. Thereby, the devices under test 110 and the test modules 103 are electrically connected.

The devices under test 110 may include electrodes such as a BGA (Ball Grid Array), an LGA (Land Grid Array), or the like. Instead of these electrodes, the devices under test 110 may include terminals such as an SOJ (Small Outline J-Leaded), a PLCC (Plastic Leaded Chip Carrier), a QFP (Quad Flat Package), an SOP (Small Outline Package), or the like. The sockets 105 are electrically connected to the electrodes, the terminals, or the like of the devices under test 110.

The handler 101 conveys devices under test 110 to be tested to the sockets 105 and conveys devices under test 110 after tested out from the sockets 105. The hander 101 of the present example conveys a plurality of devices under test 110 by placing them on a test tray 109. The handler 101 includes a heat applying section 106, a test section 107, and a heat removing section 108.

The test section 107 is a space in which a plurality of devices under test 110 are tested, and into which the test tray 109 on which devices under test 110 to be tested are placed is conveyed. The test section 107 is provided with a plurality of sockets 105, and the devices under test 110 are set on the sockets 105 respectively so as to be tested. In the present example, the test tray 109 is moved in the test section 107 toward where the plurality of sockets 105 are provided, to set the plurality of devices under test 110 on the plurality of sockets 105. The temperature of the devices under test 110 in the test section 107 is controlled to a preset test temperature.

The test section 107 includes a socket image capturing section 112 that captures an image of a socket 105. The socket image capturing section 112 captures an image showing the position of a terminal of a socket 105 that is electrically connected to a device under test 110. The socket image capturing section 112 may capture an image showing a relative position of a terminal of a socket 105 with respect to a predetermined reference position. A plurality of sockets 105 arranged in a row direction and in a column direction are provided in the test section 107. In this case, the socket image capturing section 112 in the test section 107 moves in the row direction and in the column direction to capture images of the plurality of sockets 105.

Images of the sockets 105 need not be captured each time a test tray 109 is conveyed into the test section 107. For example, when the setting of the test temperature mentioned above is changed, or when it is highly probable that the positions of the terminals of the sockets 105 have changed, such as when sockets 105 have been replaced according to the type of the devices under test 110, the socket image capturing image 112 may newly capture images of the sockets 105. The socket image capturing section 112 may capture images of the sockets 105 once in every predetermined period, or may newly capture images of the sockets 105 when the ratio of devices under test 110 judged as fail becomes equal to or higher than a predetermined value.

The heat applying section 106 is a section into which a test tray 109 on which a plurality of devices under test 110 before tested are placed is conveyed. In the heat applying section 106, the temperature of the plurality of devices under test 110 is controlled to a predetermined test temperature. The heat applying section 106 includes a device image capturing section 111 and a position adjusting section 113.

The device image capturing section 111 captures images of the plurality of devices under test 110 placed on the test tray 109 on the basis of device-under-test 110 by device-under-test 110. The device image capturing section 111 captures an image showing the position of a terminal of a device under test 110 to be electrically connected to a socket 105. The device image capturing section 111 may capture an image showing a relative position of a terminal of a device under test 110 with respect to a predetermined reference position.

The device image capturing section 111 sequentially moves from a position to a position where it faces each device under test 110, by moving with respect to the surface of the test tray 109 in the heat applying section 106. In the present example, a case will be explained in which while images of the devices under test 110 are being captured, the test tray 109 is fixed and the device image capturing section 111 moves.

The device image capturing section 111 moves in two directions, namely a first direction and a second direction, within a plane that is substantially parallel with the surface of the test tray 109. The second direction is a direction that is not parallel with the first direction. In the present example, a plurality of devices under test 110 are arranged on the test tray 109 in a row direction and in a column direction, and the first direction and the second direction are the row direction and the column direction respectively.

The position adjusting section 113 adjusts the positions of the plurality of devices under test 110 in the heat applying section 106 based on the images captured by the device image capturing section 111 and the socket image capturing section 112. That is, the position adjusting section 113 adjusts the positions of the respective devices under test 110 with respect to the sockets 105 so that the terminals of the respective devices under test 110 may be electrically connected to the terminals of the respective sockets 105 when the devices under test 110 are set on the sockets 105 in the test section 107. The place where the position adjusting section 113 of the present example adjusts the positions of the plurality of devices under test 110 is on the test tray 109.

The heat removing section 108 is a section into which a test tray 109 having been subjected to the test is conveyed from the test section 107. In the heat removing section 108, the temperature of the plurality of devices under test 110 is controlled to a temperature equal or similar to the room temperature. After the temperature of the plurality of devices under test 110 becomes equal or similar to the room temperature, the test tray 109 is conveyed out from the heat removing section 108.

The heat applying section, the test section, and the heat removing section may or may not have a chamber structure for housing the test tray 109. The heat applying section, the test section, and the heat removing section may control the temperature of the devices under test 110 by controlling the temperature in the chamber, or may directly control the temperature of the devices under test 110 by using a thermoelectric element or a cooler or a heater for circulating a cooling medium or a heating medium, or by using in combination with these means, a so-called chamber method.

Figure 2:
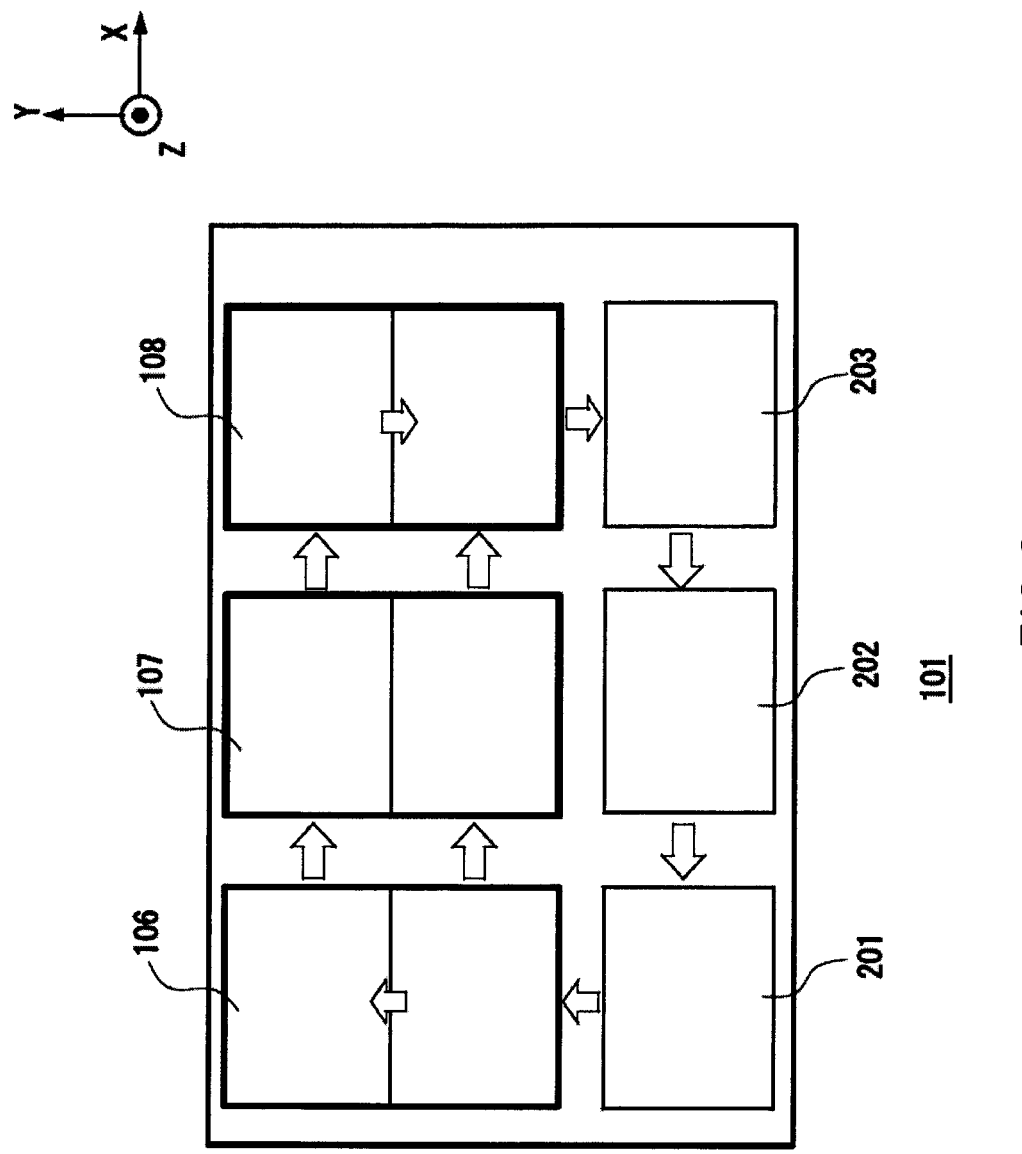
FIG. 2 shows a top view of FIG. 1.

FIG. 2 is a top view showing the overall structure of the hander 101. The handler 101 includes a loader section 201, a first un-loader section 202, and a second un-loader section 203, in addition to the heat applying section 106, the test section 107, and the heat removing section 108.

The loader section 201 conveys a test tray 109 on which a plurality of devices under test 110 are placed into the heat applying section 106. The loader section 201 may receive a user tray on which a plurality of devices under test 110 are placed, and remove the devices under test 110 from the user tray to the test tray 109. The heat applying section 106, the test section 107, and the heat removing section 108 may process a plurality of test trays 109 at the same time.

The first un-loader section 202 and the second un-loader section 203 receive a test tray 109 from the heat removing section 108. The first un-loader section 202 and the second un-loader section 203 classify the plurality of devices under test 110 according to the results of the test in the test section 107. For example, among the devices under test 110 placed on the test tray 109 received from the heat removing section 108, the second un-loader section 203 may remove passed devices under test 110 onto a user tray. The first un-loader section 202 may receive the test tray 109 from the second un-loader section 203 and remove failed devices under test 110 onto a user tray. The second un-loader section 203 conveys the emptied test tray to the loader section 201.

Figure 3:
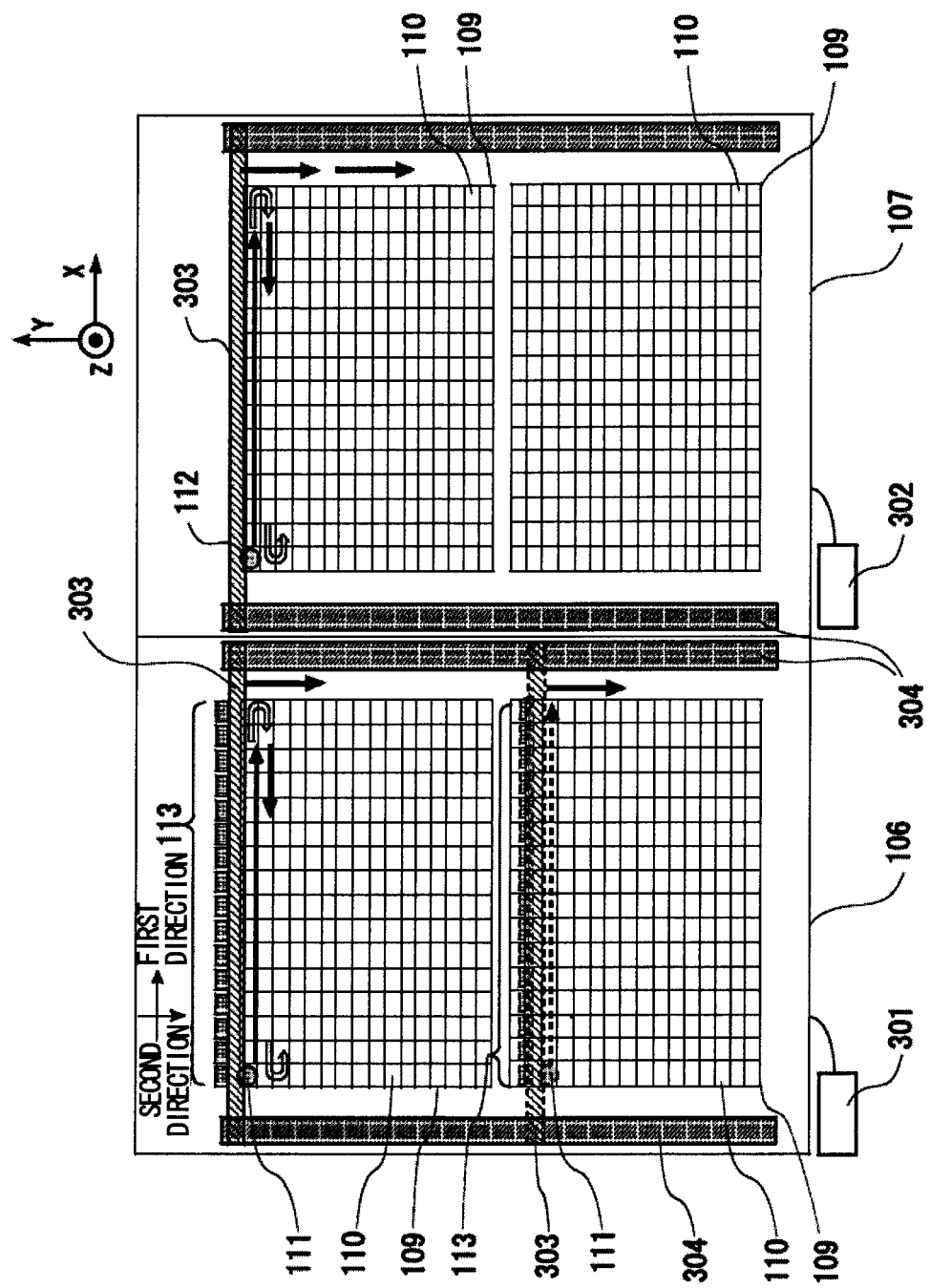
FIG. 3 shows a heat applying section and a test section.

FIG. 3 is a top view showing the heat applying section 106 and the test section 107. In FIG. 3, a device under test 110 is represented on the test tray 109 by one quadrangle exemplarily. In the present example, devices under test 110 are arranged on the test tray 109 along the row direction (X-axis direction) and the column direction (Y-axis direction). In FIG. 3, 16 rows and 16 columns of a total 256 devices under test are placed on one test tray 109. However, the number of devices under test 110 placed on one test tray 109 is not limited to this. The heat applying section 106 and the test section 107 may accommodate a plurality of test trays 109 along the Y-axis direction.

An X-support rail 303 and Y-support rails 304 are laid in each of the heat applying section 106 and the test section 107. The X-support rail 303 is provided along the X-axis direction, and the Y-support rails 304 are provided along the Y-axis direction. In each chamber, the Y-support rails 304 are provided at both ends in the X-axis direction, and are provided to extend over all of a plurality of test trays 109 in the Y-axis direction. The X-support rail 303 moves along the Y-support rails 304 with its both ends attached to the Y-support rails 304.

The device image capturing section 111 and the position adjusting section 113 are attached to the X-support rail 303 in the heat applying section 106.

The device image capturing section 111 moves in the X-axis direction (row direction) along the X-support rail 303, and moves in the Y-axis direction (column direction) along with the move of the X-support rail 303 in the Y-axis direction. Hence, the device image capturing section 111 moves in the directions substantially parallel with the row direction and column direction of the plurality of devices under test 110 arranged on the test tray 109. The moving directions of the device image capturing section 111 need not necessarily be parallel with the row direction and column direction along which the devices under test 110 are arranged, as long as images of all the devices under test 110 on the test tray 109 can be captured.

The device image capturing section 111 may sequentially capture images of a plurality of devices under test 110 arranged in the row direction, by moving in the row direction while being static with respect to the test tray 109 in the column direction. That is, the X-support rail 303 stops still while the device image capturing section 111 is capturing images of a plurality of devices under test 110 arranged in the row direction. Then, when the device image capturing section 111 has captured images of all the devices under test 110 in that row, the X-support rail 303 moves in the Y-axis direction to let the images of devices under test 110 in the next row be captured. In the respective chambers, illuminators for capturing images of the devices under test 110 and the sockets 105 are provided. The illuminators move by following the respective image capturing sections.

The device image capturing section 111 may reciprocate in the row direction, and may move in the column direction so as to capture images of a plurality of devices under test 110 included in different rows between when it moves forward in the row direction and when it moves backward in the row direction. That is, when capturing images of devices under test 110 in a given row, the device image capturing section 111 may move in the rightward direction in FIG. 3, and when capturing images of devices under test 110 in the next row, the device image capturing section 111 may move in the leftward direction in FIG. 3.

The position adjusting section 113 adjusts the positions of a plurality of devices under test 110 on the test tray 109 in the heat applying section 106. The position adjusting section 113 includes an actuator that visits a plurality of devices under test 110 and adjusts the positions of the plurality of visited devices under test 110. In the present example, a plurality of such actuators are provided along the X-support rail 303. For example, there may be provided the same number of actuators as the number of the plurality of devices under test 110 arranged in the X-axis direction. Each actuator visits devices under test 110 arranged in the Y-axis direction along with the move of the X-support rail 303 in the Y-axis direction.

The device image capturing section 111 is provided ahead of the position adjusting section 113 when seen in the moving direction of the X-support rail 303. The position adjusting section 113 is provided behind the device image capturing section 111 by at least one row of devices under test 110. The actuators of the position adjusting section 113 adjust the positions of a plurality of devices under test 110 of which images have already been captured, while the device image capturing section 111 is capturing an image of any of a plurality of devices under test 110. Note that the period represented by the phrase "while the device image capturing section 111 is capturing an image of a device under test 110" also includes a period during which the device image capturing section 111 moves in the X-axis direction to capture an image. The actuators of the position adjusting section 113 of the present example adjust the positions of the devices under test 110 in a row in which image capture has already been finished, while the device image capturing section 111 is capturing images of devices under test 110 in a given row.

In the heat applying section 106, the device image capturing section 111 may again capture images of a plurality of devices under test 110, the positions of which have been adjusted by the position adjusting section 113. In this case, imaging elements to be used may be the imaging elements that previously captured images of devices under test 110 for position adjustment of the devices under test 110, or may be other imaging elements. When the positions of devices under test 110 after position-adjusted are not aligned with predetermined positions, the position adjusting section 113 may again perform position adjustment. When the test time for a plurality of devices under test 110 that are being tested in the test section 107 is longer than a predetermined reference time, the device image capturing section 111 may again capture images of a plurality of devices under test 110, the positions of which have been adjusted by the position adjusting section 113. More specifically, the device image capturing section 111 may perform such an additional image capture for any devices under test 110 after position-adjusted, if the timing at which the additional image capture ends comes earlier than the timing at which the test performed in test section 107 ends.

The socket image capturing section 112 is provided on the X-support rail 303 in the test section 107. The movements of the X-support rail 303 and the socket image capturing section 112 in the test section 107 are the same as the movements of the X-support rail 303 and the device image capturing section 111 in the heat applying section 106. However, the socket image capturing section 112 captures images of the sockets 105 shown in FIG. 1, not the devices under test 110.

A soak-side temperature control device 301 is connected to the heat applying section 106. The soak-side temperature control device 301 controls the temperature of a plurality of devices under test 110 to a predetermined test temperature. The soak-side temperature control device 301 may include a thermoelectric element such as a Peltier element or the like for each device under test 110, or may control the temperature by circulating a cooling medium or a heating medium along the devices under test 110.

A test-side temperature control device 302 is connected to the test section 107. The test-side temperature control device 302 controls the temperature of the devices under test 110 in the test section 107 to a predetermined test temperature. The test-side temperature control device 302 may control the ambient temperature in the test section 107, or may directly control the temperature of the devices under test 110 by a Peltier element or the like.

Figure 4:
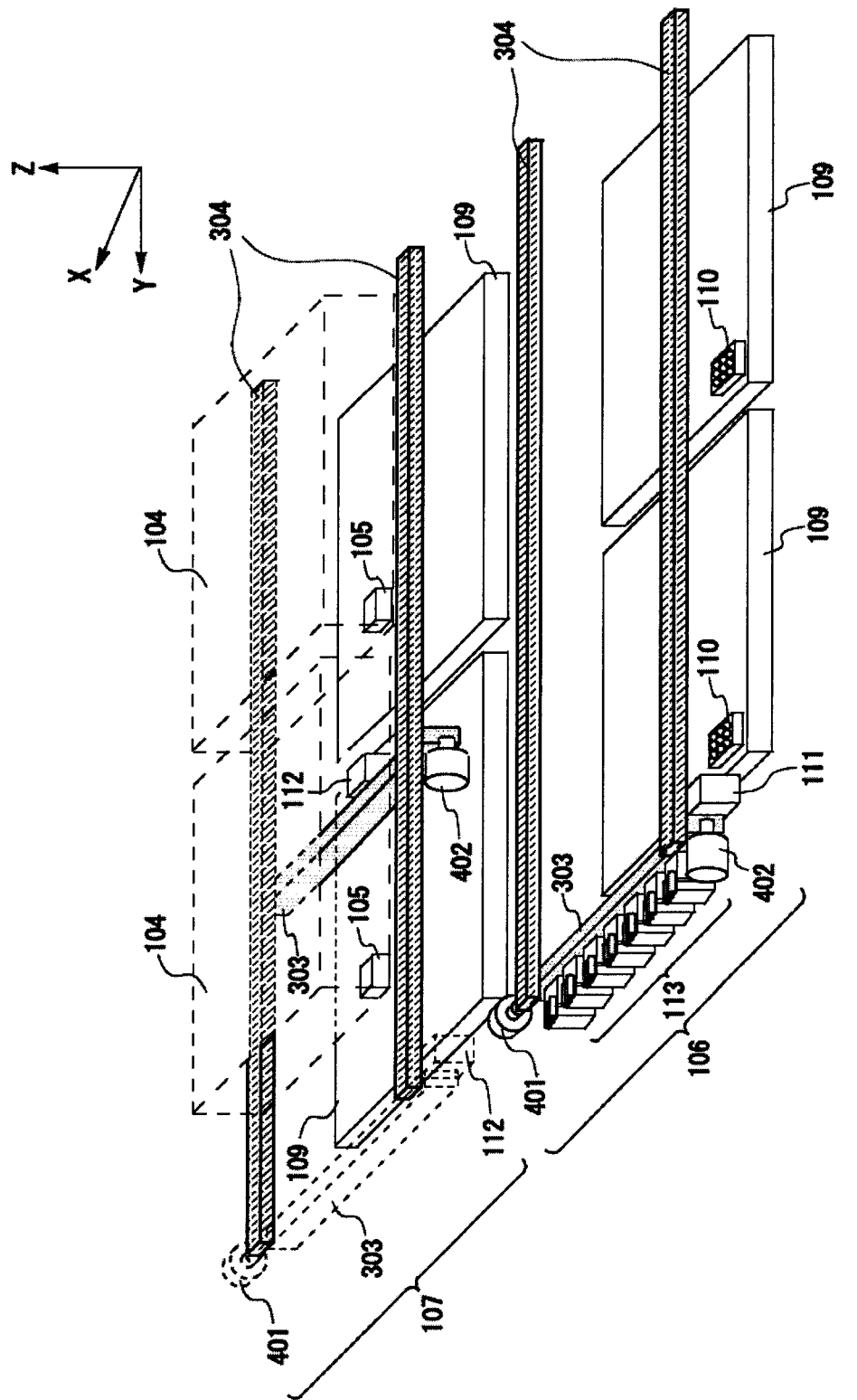
FIG. 4 shows a perspective view of the heat applying section and the test section.

FIG. 4 is a perspective view of the heat applying section 106 and the test section 107 in the handler 101. The X-support rails 303 move in the Y-axis direction along the Y-support rails 304 by means of X-support rail motors 401. Hence, the position adjusting section 113, the device image capturing section 111, and the socket image capturing section 112 move in the Y-axis direction along with the X-support rails 303. The device image capturing section 111 and the socket image capturing section 112 move in the X-axis direction along the X-support rails 303 by means of image capturing section motors 402.

Figure 5:
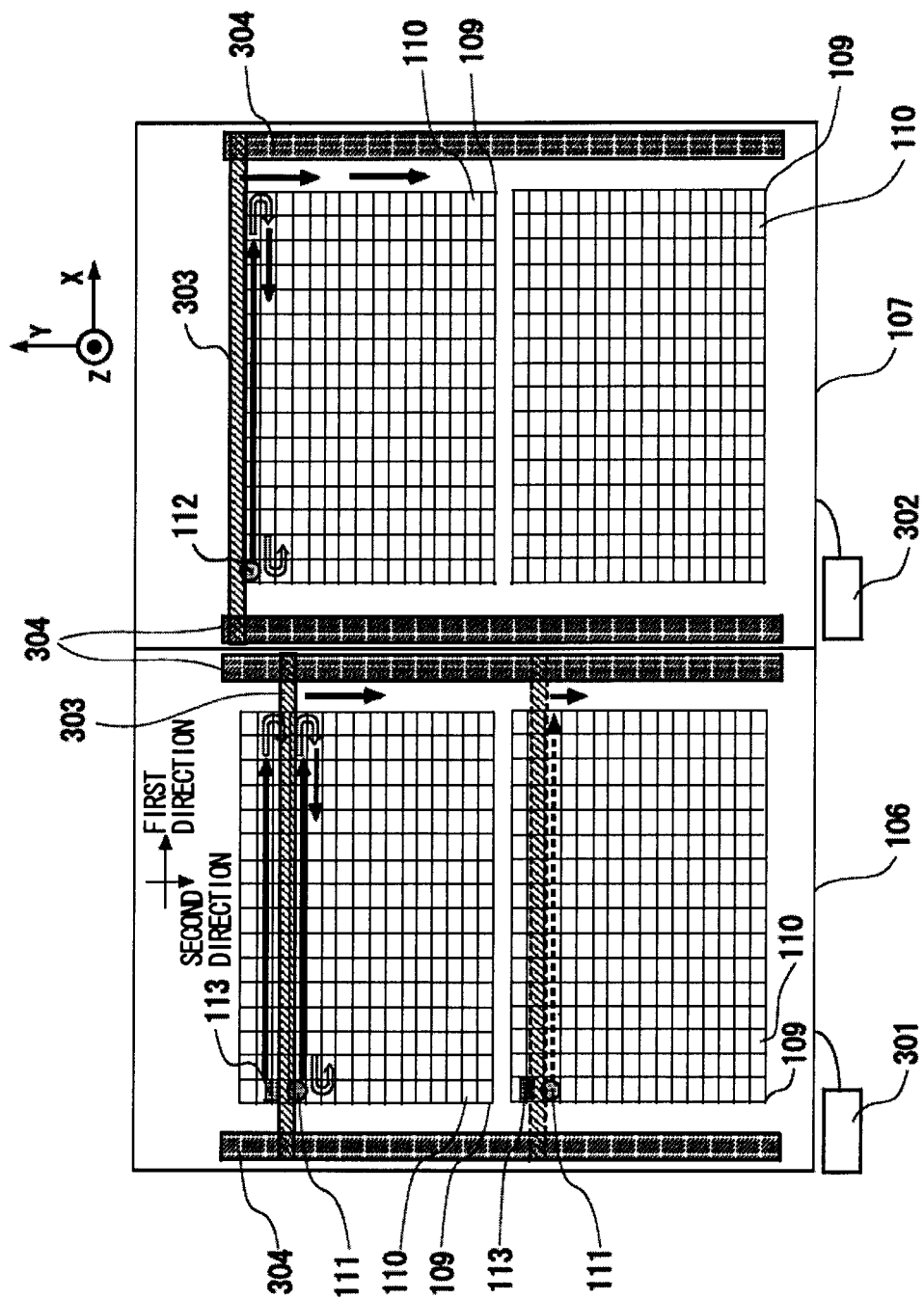
FIG. 5 shows another configuration example of the heat applying section and the test section.

FIG. 5 shows another configuration example of the heat applying section 106 and the test section 107. In this configuration example, the heat applying section 106 includes one device image capturing section 111 and one position adjusting section 113. The device image capturing section 111 and the position adjusting section 113 move in the X-axis direction (row direction) along the X-support rail 303, and move in the Y-axis direction (column direction) along with the move of the X-support rail 303 in the Y-axis direction. Thereby, the device image capturing section 111 moves in the directions that are substantially parallel with the row direction and column direction of a plurality of devices under test 110 arranged on a test tray 109.

The device image capturing section 111 and the position adjusting section 113 may perform image capture and position adjustment of devices under test 110 arranged in the row direction, by moving in the first direction while being static with respect to the test tray 109 in the second direction. That is, the X-support rail 303 stops still while the device image capturing section 111 and the position adjusting section 113 are performing image capture and position adjustment of a plurality of devices under test 110 arranged in the row direction. Then, when the device image capturing section 111 has captured images of all the devices under test 110 in that row and the position adjusting section 113 has adjusted all the devices under test 110 in that row, the X-support rail 303 moves in the Y-axis direction to let the images of devices under test 110 in the next row be captured. The position adjusting section 113 may reciprocate in the first direction, and may also move in the second direction so as to adjust the devices under test 110 included in different rows between when it moves forward in the first direction and when it moves backward in the first direction. The configuration of the test section 107 is the same as in FIG. 3, and hence will not be described below.

Figure 6:
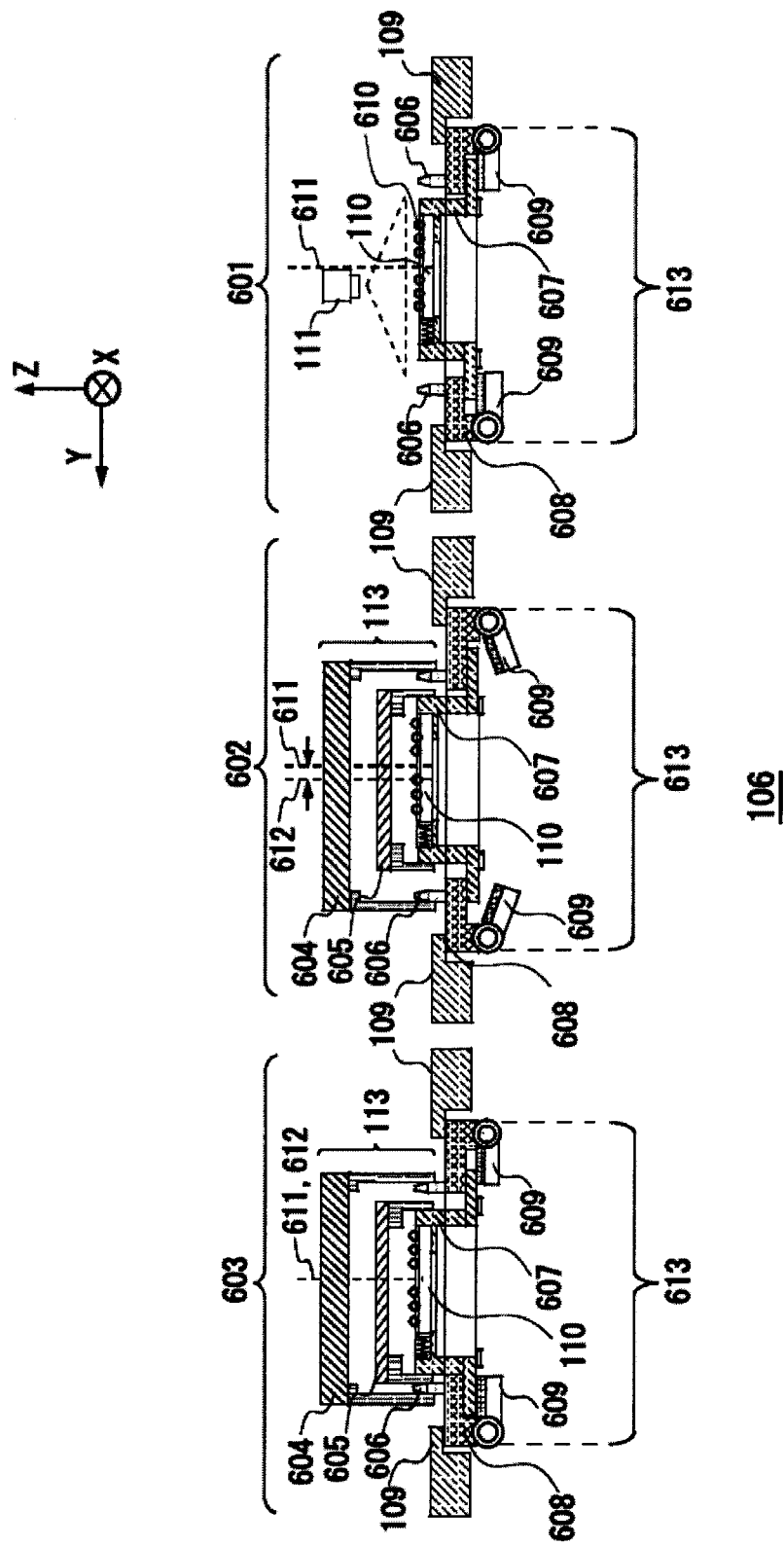
FIG. 6 shows how image capture and position alignment are performed in the heat applying section.

FIG. 6 shows how image capture and position alignment of devices under test 110 are performed in the heat applying section 106. A device under test 110 of the present example is placed on an insert 613 that is fixed on the test tray 109. The insert 613 is fixed on the test tray 109 while being allowed to move within a predetermined range. The right-hand portion 601 of FIG. 6 shows a state of the device image capturing section 111 capturing an image of a device under test 110. The center portion 602 of FIG. 6 shows a state after the device image capturing section 111 has captured an image of the device under test 110 and before an actuator 605 of the position adjusting section 113 performs position alignment. The left-hand portion 603 of FIG. 6 shows a state after the device image capturing section 111 has captured an image of the device under test 110 and when the actuator 605 of the position adjusting section 113 has finished position alignment.

The position adjusting section 113 includes a fixing section 604 and an actuator 605. The fixing section 604 fixes the position adjusting section 113 onto the insert 613. For example, the fixing section 604 is fixed to reference pins 606 of the insert 613 to be described later. The actuator 605 is provided movable and rotatable with respect to the fixing section 604 within a plane including the X-axis and the Y-axis. With the fixing section 604 fixed to the reference pins 606 and with the actuator 605 moving while directly or indirectly holding a device under test 110, the position of the device under test 110 with respect to the reference pins 606 is adjusted.

The insert 613 includes the reference pins 606, an inner unit 607, an outer unit 608, and a releasing section 609, and a device under test 110 is set thereon. A device under test 110 is placed on the inner unit 607. The outer unit 608 is fixed to the test tray 109. The releasing section 609 switches the inner unit 607 between a locked state (fixed state) and a lock-released state (unfixed state) with respect to the outer unit 608. The reference pins 606 function as positioning pins for when connecting the insert 613 to a socket 105. For example, the reference pins 606 are inserted or fitted into reference pin inserting portions 702 (to be shown in FIG. 7A described below) provided in the socket 105. A plurality of such reference pins 606 are provided on a surface of the outer unit 608 facing the socket 105.

As shown in the right-hand portion 601 of FIG. 6, the device image capturing section 111 captures an image of the insert 613. The device image capturing section 111 captures an image that includes the reference pins 606 and at least a portion of a device under test 110. For example, the device image capturing section 111 captures an image that includes the reference pins 606 and all ball terminals 610 of a device under test 110. Thereby, the relative position of a device center position 611, which is the center position of the device under test 110, with respect to the reference pins 606 is detected. Note that at this time, locking by the releasing section 609 is effected.

Figure 7A:
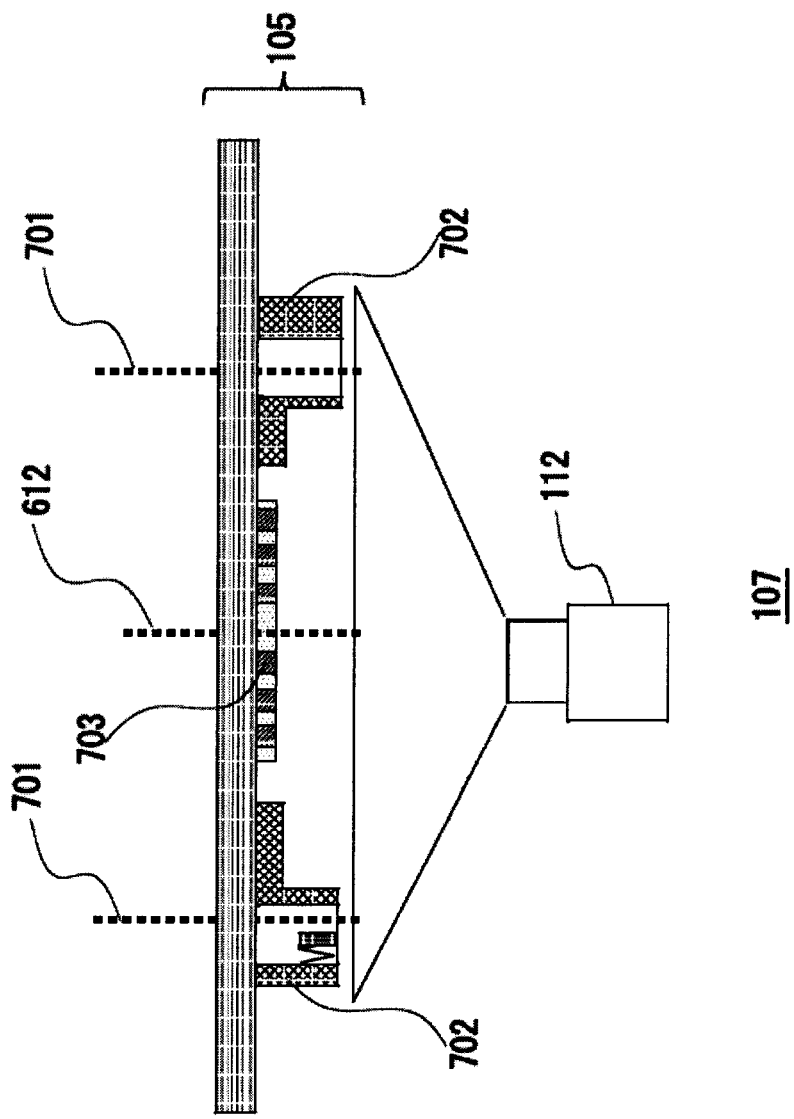
FIG. 7A shows how the position of a socket is detected in the test section.

After this, as shown in the center portion 602 of FIG. 6, the position adjusting section 113 is brought above the insert 613. At this stage, a socket center position 612, which has been acquired beforehand, does not necessarily coincide with the device center position 611. As shown in FIG. 7A, the socket center position 612 indicates the relative position of the center position of the socket 105 with respect to the reference pin inserting portions 702 of the socket 105 that correspond to the reference pins 606. The fixing section 604 fixes the position adjusting section 113 to the outer unit 608, and the actuator 605 grasps the inner unit 607. After this, locking by the releasing section 609 is released.

Then, as shown in the left-hand portion 603 of FIG. 6, the actuator 605 fine-tunes the position of the device under test 110 so as to make the socket center position 612 coincide with the device center position 611. After the actuator 605 fine-tunes the position of the device under test 110, locking by the releasing section 609 is effected again.

FIG. 7A to FIG. 7F are diagrams showing a sequential flow from when the position of a socket 105 is detected in the test section 107 to when terminals 703 and a device under test 110 are connected in the test section 107.

FIG. 7A shows how the position of a socket 105 is detected in the test section 107. The socket 105 includes terminals 703 to be connected to the ball terminals 610 of a device under test 110, and reference pin inserting portions 702. The socket image capturing section 112 captures an image of the socket 105 from below. The socket image capturing section 112 captures an image that includes the reference pin inserting sections 702 and at least some of the terminals 703. The socket image capturing section 112 of the present example captures an image that includes all of the reference pin inserting portions 702 and all of the terminals 703. From the captured image, the socket center position 612 with respect to reference pin center positions 701 is detected.

Figure 7B:
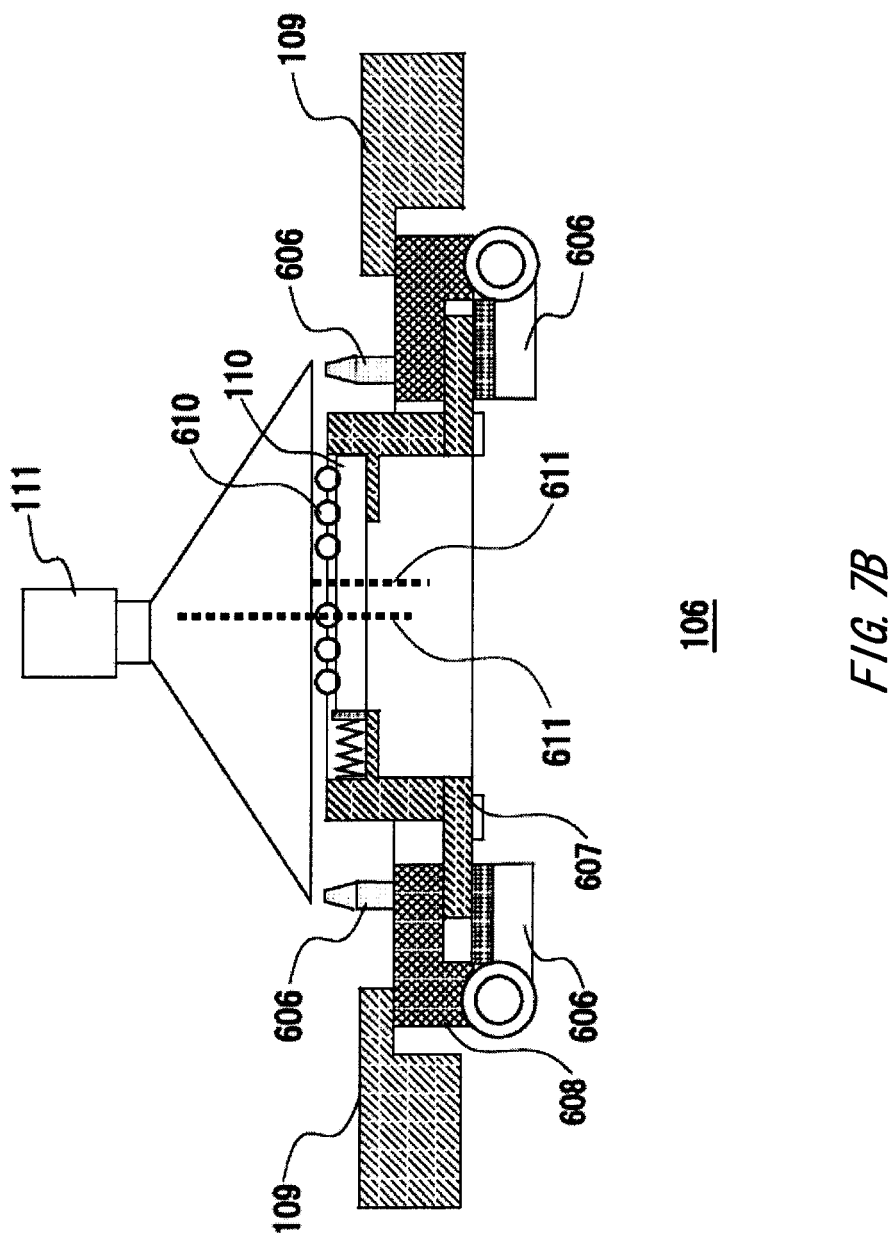
FIG. 7B shows how a device center position and the positions of reference pins are detected in the heat applying section.

FIG. 7B shows how the device center position 611 with respect to the reference pins 606 is detected in the heat applying section 106. The device image capturing section 111 captures an image that includes the reference pins 606 and all of the ball terminals 610 of a device under test 110. Thereby, the device center position 611 with respect to the reference pins 606 is detected.

Figure 7C:
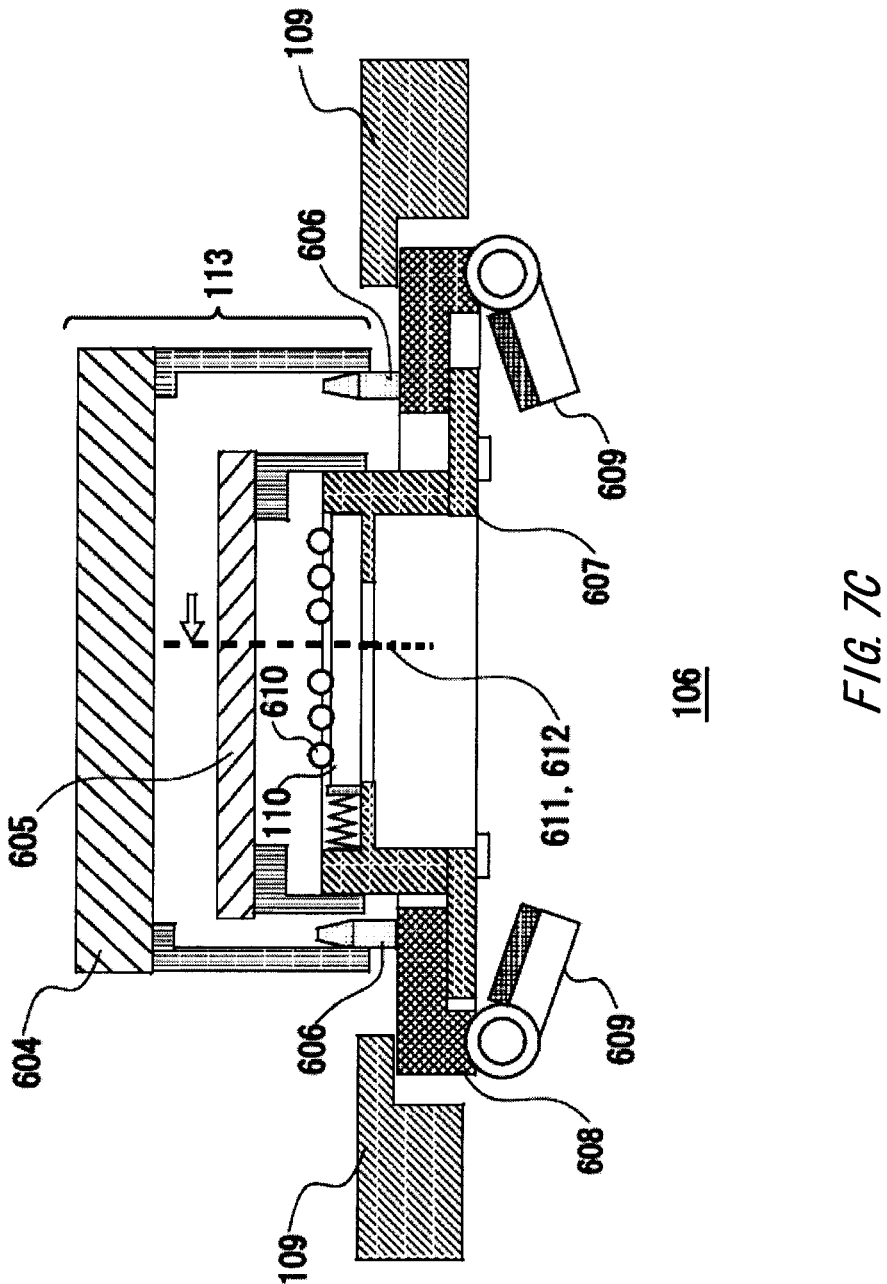
FIG. 7C shows how the position of an inner unit is corrected in the heat applying section.

FIG. 7C shows how the position of the inner unit 607 is corrected in the heat applying section 106. The actuator 605 fine-tunes the position of the inner unit 607 so as to align the socket center position 612 acquired in the stage of FIG. 7A with the device center position 611 acquired in the stage of FIG. 7B. Here, the reference pins 606 are used as the reference positions for the socket center position 612.

Figure 7D:
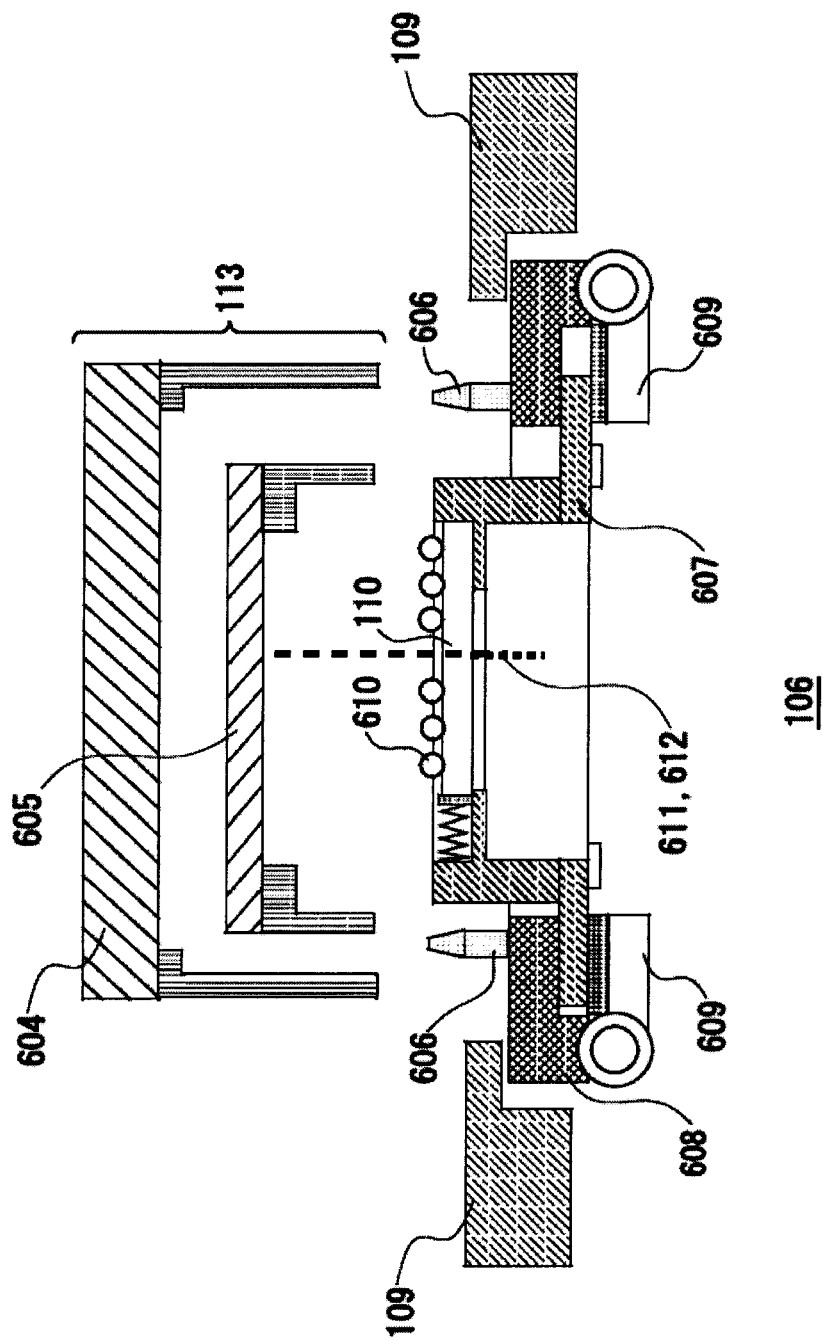
FIG. 7D shows how a position adjusting section moves in the heat applying section.

FIG. 7D shows how the position adjusting section 113 moves in the heat applying section 106. After the position adjustment of FIG. 7C is completed, locking by the releasing section 609 is effected again. Then, the position adjusting section 113 moves upward, and moves to a position facing the next device under test 110. After position adjustment is completed for all the devices under test 110 on the test tray 109, the test tray 109 is conveyed into the test section 107.

Figure 7E:
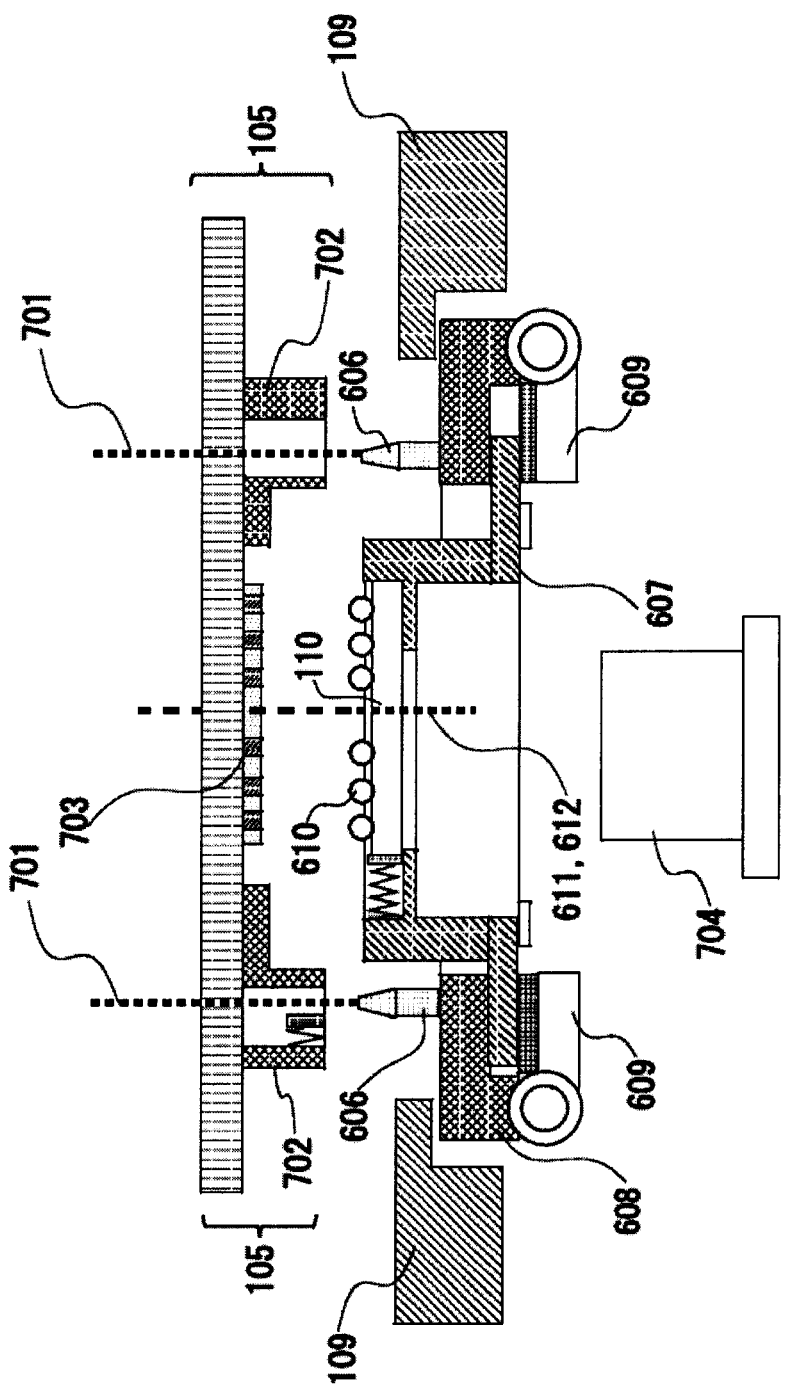
FIG. 7E shows how the position of a reference pin and the position of a socket are aligned in the test section.

FIG. 7E shows how the device under test 110 is connected to the socket 105 in the test section 107. In the test section 107, the test tray 109 is moved close to the socket 105. Then, with each insert 613 pushed toward the socket 105 by a pusher 704, the reference pins 606 are inserted into the reference pin inserting portions 702.

The reference pin 606 may have a tapered shape of which diameter is reduced toward the tip. The inner diameter of the reference pin inserting portion 702 may be larger than the outer diameter of the reference pin 606. Because each insert 613 is fixed to the test tray 109 with some allowance, the reference pins 606 can be inserted into the reference pin inserting portions 702 even if the position of the insert 613 is slightly misaligned from the position of the socket 105. The socket 105 may include pushing members that push the reference pins 606 inserted into the reference pin inserting portions 702 onto the side wall of the reference pin inserting portions 702. With this configuration, it is possible to fix the positional relationship between the insert 613 and the socket 105 precisely while absorbing the misalignment of the insert 613.

Figure 7F:
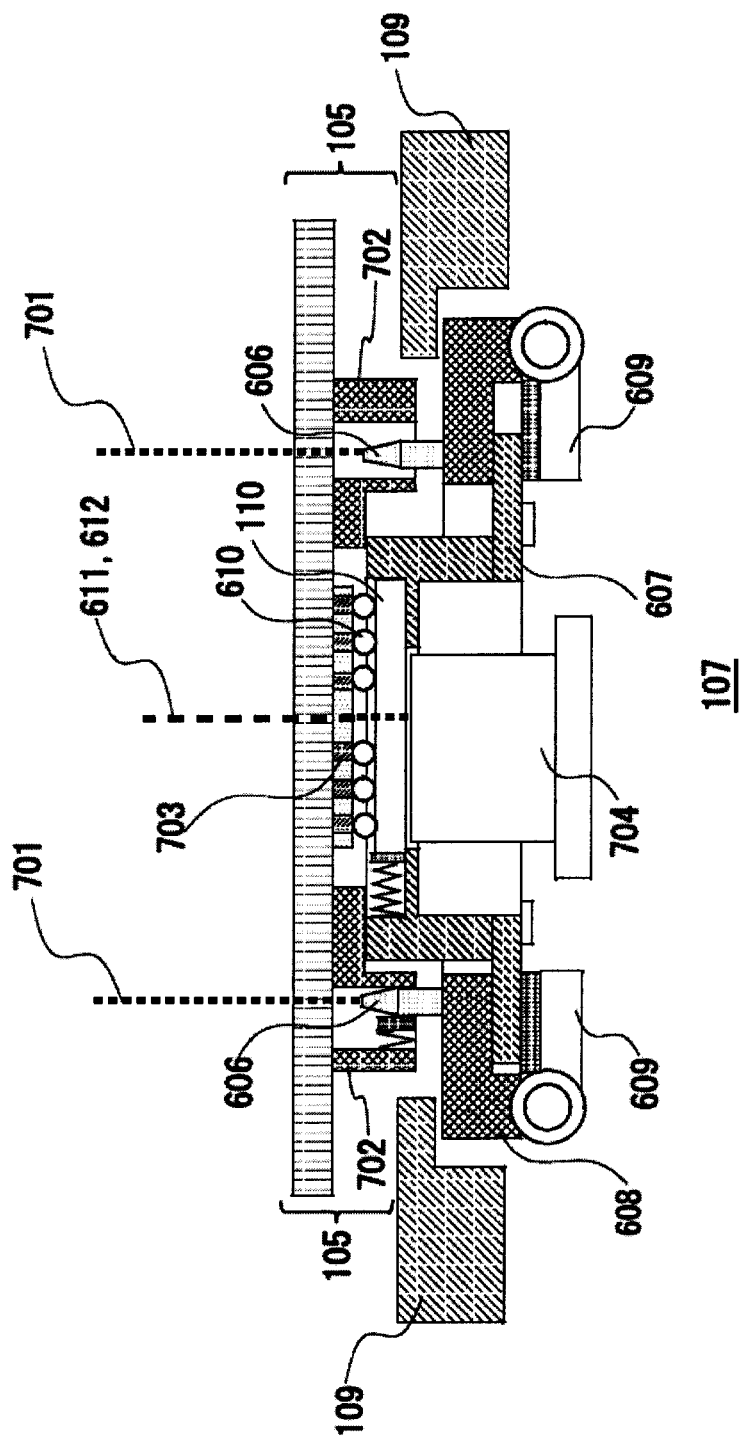
FIG. 7F shows how a device under test and a socket come into contact in the test section.

FIG. 7F shows how the device under test 110 and the socket 105 come into contact in the test section 107. Since the position of the device under test 110 has already been adjusted in the stage of FIG. 7C such that the relative position of the device center position 611 with respect to the reference pins 606 coincides with the socket center position 612 with respect to the reference pin inserting portions 702, the device center position 611 and the socket center position coincide with each other when the reference pins 606 are inserted into the reference pin inserting portions 702. This allows precise position alignment between the device under test 110 and the socket 105.

Figure 8:
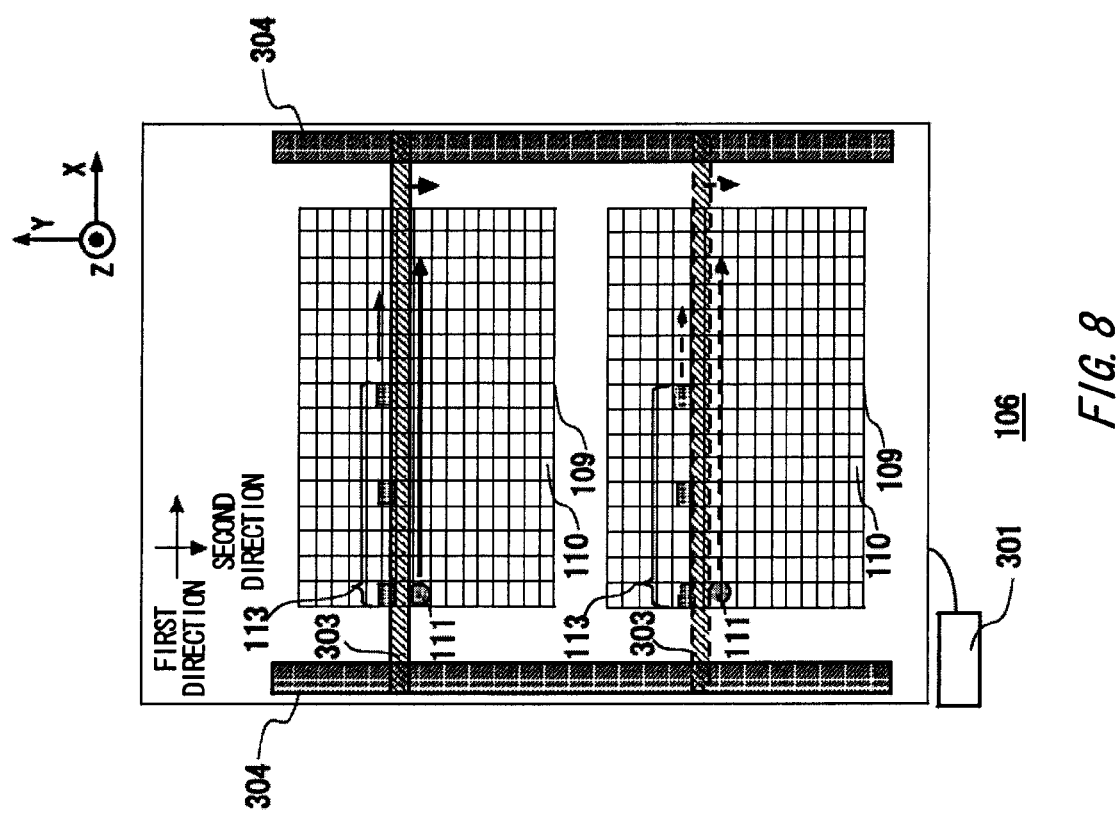
FIG. 8 shows a top view of a heat applying section according to a second embodiment of the present invention.

FIG. 8 shows a top view of the heat applying section 106 according to a second embodiment of the present invention. In this configuration example, the heat applying section 106 includes one device image capturing section 111 and a position adjusting section 113 including a plurality of actuators. The plurality of actuators are arranged as spaced apart by an interval corresponding to some devices under test 110. In this case, the intervals between the plurality of actuators are, for example, equal intervals. The device image capturing section 111 and the position adjusting section 113 move in the first direction along the X-support rail 303, and move in the second direction along with the move of the X-support rail 303 in the second direction. Thereby, the device image capturing section 111 and the position adjusting section 113 move in the directions that are substantially parallel with the row direction and column direction of the plurality of devices under test 110 arranged on the test tray 109.

Figure 9:
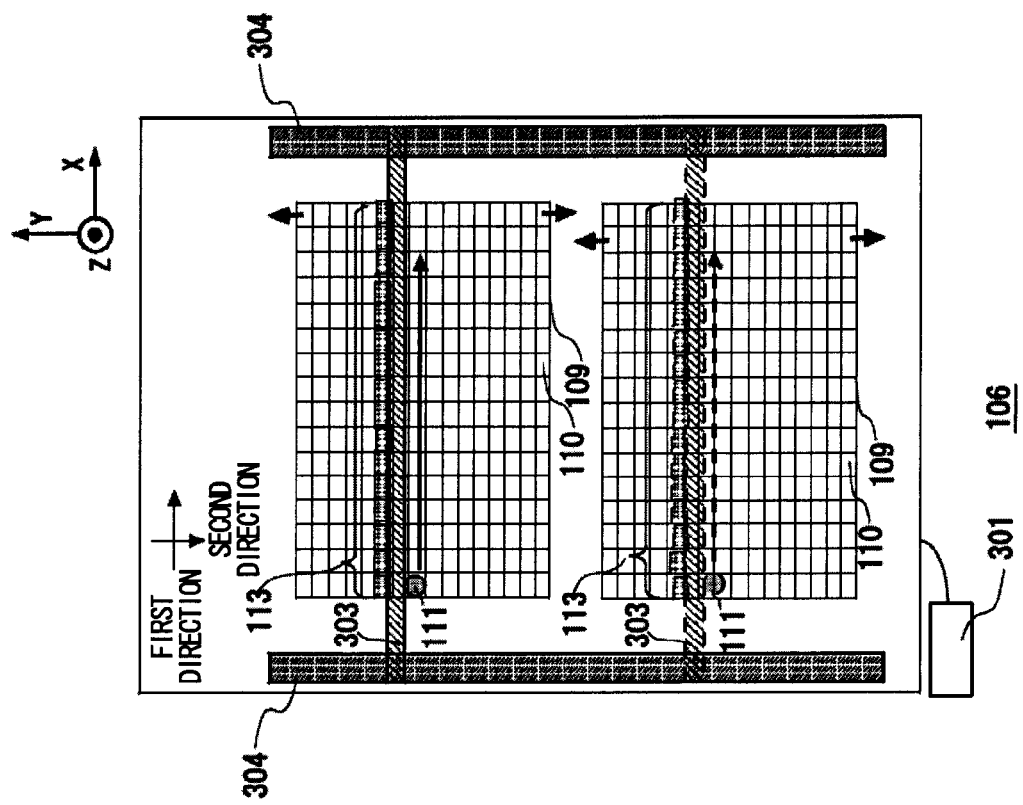
FIG. 9 shows a top view of a heat applying section according to a third embodiment of the present invention.

FIG. 9 shows a top view of the heat applying section 106 according to a third embodiment of the present invention. In this configuration example, the heat applying section 106 includes one device image capturing section 111 and a position adjusting section 113 including a number of actuators that corresponds to the number of devices under test 110 in one row of the test tray 109. The test tray 109 moves in the second direction. The position adjusting section 113 does not move in the first direction, but moves in the second direction along with the move of the X-support rail 303 in the second direction. On the other hand, the device image capturing section 111 moves in the first direction along the X-support rail 303, and moves in the second direction along with the move of the X-support rail 303 in the second direction. Thereby, the device image capturing section 111 moves in the direction that are substantially parallel with the row direction and column direction of the plurality of devices under test 110 arranged on the test tray 109.

The device image capturing section 111 may sequentially capture images of devices under test 110 arranged in the row direction by moving in the first direction while being static with respect to the test tray 109 in the second direction. That is, the X-support rail 303 stops still while the device image capturing section 111 is capturing images of the plurality of devices under test 110 arranged in the row direction. Then, when the device image capturing section 111 has captured images of all the devices under test 110 in that row and the position adjusting section 113 has adjusted all the devices under test 110 in that row, the X-support rail 303 moves in the second direction to let the images of devices under test 110 in the next row be captured.

Figure 10:
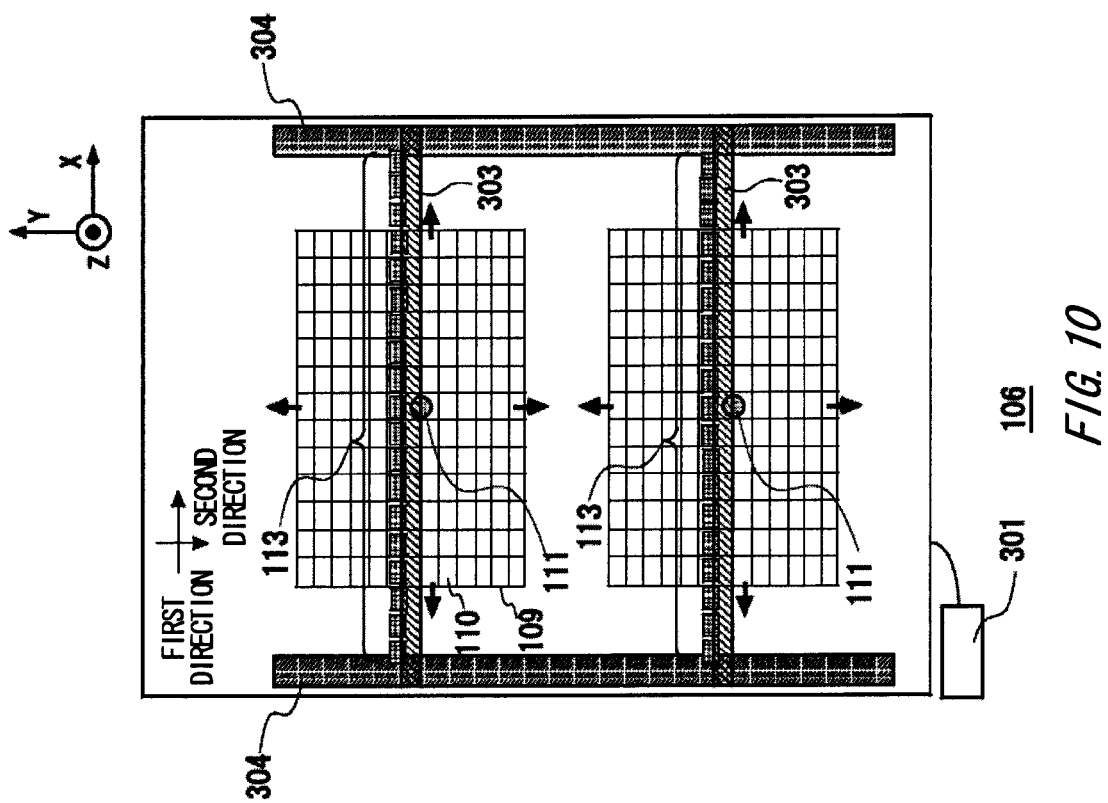
FIG. 10 shows a top view of a heat applying section according to a fourth embodiment of the present invention.

FIG. 10 shows a top view of the heat applying section 106 according to a fourth embodiment of the present invention. In this configuration example, the test tray 109 moves in the first direction and in the second direction. The heat applying section 106 includes one device image capturing section 111 and a position adjusting section 113 including a number of actuators that is larger than the number of devices under test 110 in one row of the test tray 109. In this example, the device image capturing section 111 and the position adjusting section 113 are fixed.

While the test tray 109 is moved in the first direction and in the second direction, the device image capturing section 111 captures images of devices under test 110 and the position adjusting section 113 adjusts the positions of the devices under test 110. In another embodiment, the device image capturing section 111 and the position adjusting section 113 may move in either one of the first direction and the second direction, whereas the test tray 109 may move in the other direction. When the test tray 109 moves in the first direction, the test tray 109 can move within a range in which position adjustment by the position adjusting section 113 can be effected.

Figure 11:
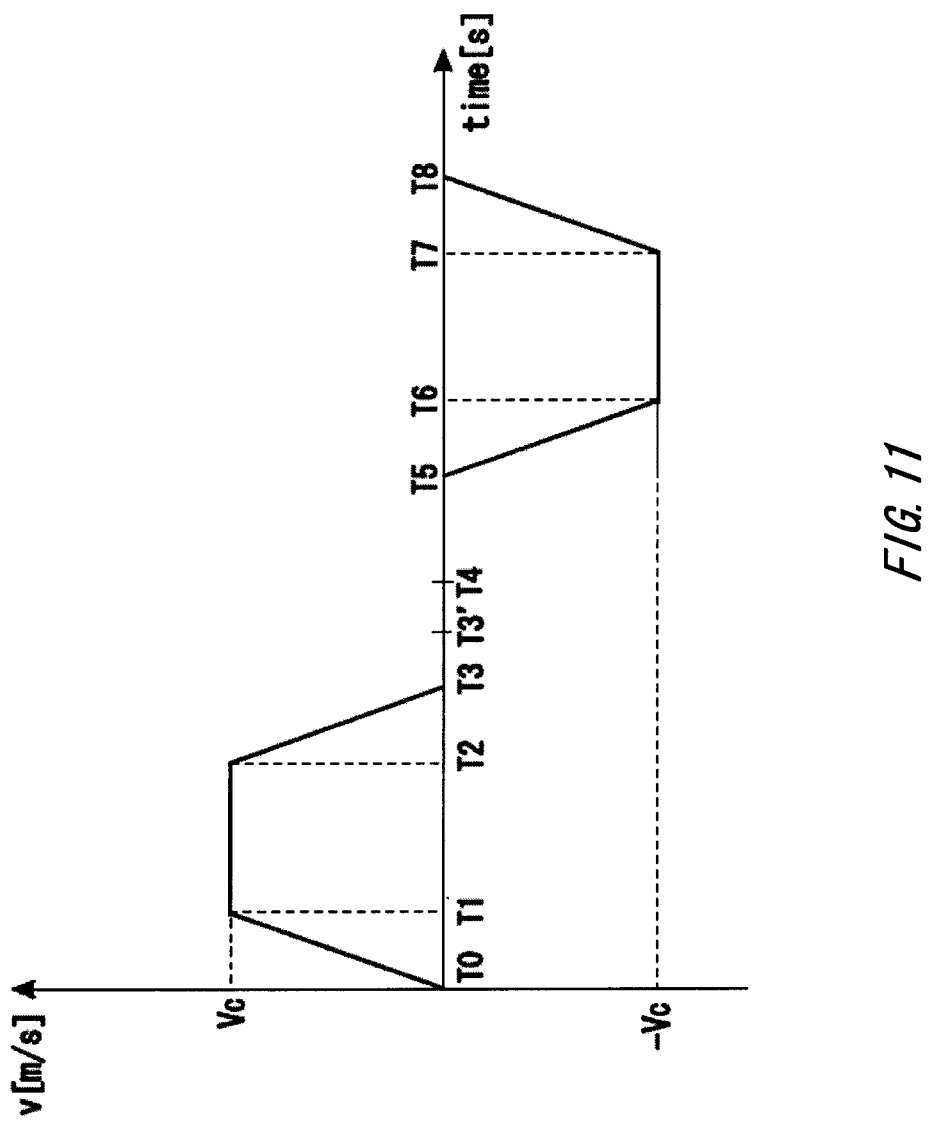
FIG. 11 shows how the velocity of a device image capturing section changes.

FIG. 11 shows how the velocity of the device image capturing section 111 changes. The device image capturing section 111 scans the devices under test 110 in the i-th row from a time $T_o$ to a time $T_3$, moves in the column direction from the time $T_3$ to a time $T_5$, and scans the (i+1)-th row from the time $T_5$ to a time $T_g$.

The device image capturing section 111 starts an accelerated motion at the time $T_0$, and changes to a uniform motion of a velocity $v_c$ m/s at the time $T_1$. The device image capturing section 111 captures images of devices under test 110 in the i-th row from the time $T_1$ to the time $T_2$ during which it moves at the velocity $v_c$ m/s. Then, the device image capturing section 111 starts to decelerate at the time $T_2$ and stops at the time $T_3$.

The moving velocity $v_c$ of the device image capturing section may be set according to an image pickup velocity. That is, when the image pickup velocity is high, the velocity $v_c$ is set high, whereas when the image pickup velocity is low, the velocity $v_c$ is set low.

After moving in the column direction from the time $T_3$ to the time $T_5$, the device image capturing section 111 captures images of devices under test 110 in the (i+1)-th row from the time $T_5$ to the time $T_8$. As in the i-th row, the device image capturing section 111 captures images from a time $T_6$ to a time $T_7$ during which the velocity is a uniform velocity $(-v_c)$. Image processing for the devices under test 110 in the i-th row should be completed before the actuator 605 starts position adjustment for the devices under test 110 in the i-th row.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A handler for conveying a plurality of devices under test to a socket for a test, comprising:
    a test section in which the socket is provided;
    a heat applying section into which a tray on a surface of which the plurality of devices under test are placed is conveyed, and that controls a temperature of the plurality of devices under test to a predetermined test temperature and conveys the tray into the test section;
    a device image capturing section that in the heat applying section, captures images of respective ones of the devices under test by moving with respect to the surface of the tray in two non-parallel directions, which are a first direction and a second direction; and
    a position adjusting section that adjusts positions of the plurality of devices under test on the tray in the heat applying section with respect to the socket corresponding to the devices under test, based on the images of the plurality of devices under test captured by the device image capturing section, wherein the plurality of devices under test are placed on the tray in a switchable manner between a locked state and a lock-released state.

2. The handler according to claim 1,
    wherein the device image capturing section moves in the first direction and the second direction that are substantially parallel with a row direction and a column direction of the plurality of devices under test arranged on the tray, respectively.

3. The handler according to claim 2,
    wherein the device image capturing section sequentially captures images of the devices under test arranged in the row direction, by moving in the first direction while being static with respect to the tray in the second direction.

4. The handler according to claim 3,
    wherein the device image capturing section reciprocates in the first direction, and moves in the second direction so as to capture images of the devices under test included in different rows between when the device image capturing section moves forward in the first direction and when the device image capturing section moves backward in the first direction.

5. The handler according to claim 2,
    wherein the position adjusting section includes an actuator that visits two or more of the devices under test and adjusts the position of each of the visited devices under test.

6. The handler according to claim 5,
    wherein while the device image capturing section is capturing an image of any of the devices under test, the actuator adjusts the position of the device under test, the image of which has already been captured.

7. The handler according to claim 5,
    wherein the position adjusting section includes a plurality of the actuators that are arranged in the row direction, and moves the plurality of actuators in the column direction.

8. The handler according to claim 7,
    wherein a number of the actuators arranged in the row direction is equal to a number of the devices under test arranged in the row direction.

9. The handler according to claim 2,
    wherein the device image capturing section again captures images of the plurality of devices under test, the positions of which have been adjusted by the position adjusting section.

10. The handler according to claim 9,
    wherein when a test time for the plurality of devices under test that are being tested in the test section is longer than a predetermined reference time, the device image capturing section again captures images of the devices under test, the positions of which have been adjusted by the position adjusting section.

11. The handler according to claim 2, further comprising a socket image capturing section that captures an image of the socket,
    wherein the position adjusting section adjusts the positions of the devices under test based on the images captured by the device image capturing section and the socket image capturing section.

12. The handler according to claim 11,
    wherein the test section includes a plurality of the sockets that are arranged in the row direction and the column direction, and
    the socket image capturing section captures images of respective ones of the sockets by moving in the row direction and the column direction in the test section.

13. The handler according to claim 11,
wherein the socket image capturing section newly captures images of the sockets when a setting for a temperature in the test section is changed.

14. A test apparatus for testing a device under test, comprising:
a test head that is electrically connected to the device under test via the socket;
a test module that tests the device under test via the test head; and
the handler according to claim 1 that conveys the device under test to the socket.

15. The handler according to claim 1, further comprising
an insert on which one of the plurality of devices under test is placed, the insert being fixed on the tray while being allowed to move within a predetermined range.

* * * * *